United States Patent [19]

Fulenwider

[11] 3,947,708

[45] Mar. 30, 1976

[54] APPARATUS FOR AND METHOD OF CONVERTING FROM A DIGITAL SIGNAL TO AN ACOUSTIC WAVE USING A PIEZOELECTRIC BEAM

[75] Inventor: John E. Fulenwider, Concord, Mass.

[73] Assignee: GTE Laboratories Incorporated, Waltham, Mass.

[22] Filed: Nov. 27, 1974

[21] Appl. No.: 527,668

[52] U.S. Cl. .................... 310/8.1; 310/8.5; 310/8.3; 310/9.8; 179/110 A; 340/347 R

[51] Int. Cl.$^2$ .......................................... H01L 41/04

[58] Field of Search .......... 310/8, 8.1, 8.3, 8.5, 8.6, 310/9.7, 9.8; 340/347

[56] References Cited

UNITED STATES PATENTS

| | | | |
|---|---|---|---|
| 2,966,673 | 12/1960 | Guernsey, Jr. | 310/8.1 X |
| 2,995,736 | 8/1961 | Tellerman | 310/8.1 X |
| 3,087,148 | 4/1963 | Ludewig, Jr. | 310/8.1 X |
| 3,093,710 | 6/1963 | Eyck | 310/8.5 X |
| 3,153,229 | 10/1964 | Roberts | 310/9.8 X |
| 3,585,416 | 6/1971 | Mellen | 310/8.6 X |

*Primary Examiner*—Mark O. Budd
*Attorney, Agent, or Firm*—Irving M. Kriegsman; Leslie J. Hart

[57] ABSTRACT

A piezoelectric beam is fixed at one end and is subdivided into segments, each of which is deflected by a logic one in one of the magnitude bit locations of a digital word. The total deflection of the beam is related to the total magnitude of the digital word. The segment closest to the fixed end is controlled by the most significant bit, and the segment closest to the free end is controlled by the least significant bit. The free end is connected to the cone of a speaker so that the acoustic signal resulting from the motion of the cone is related to the digital word. A buffer regulates the polarity of the voltages applied to each segment according to the sign bit in the word so that the beam deflects in either of two directions depending on the polarity of the digital word.

14 Claims, 3 Drawing Figures

APPARATUS FOR AND METHOD OF CONVERTING FROM A DIGITAL SIGNAL TO AN ACOUSTIC WAVE USING A PIEZOELECTRIC BEAM

BACKGROUND OF THE INVENTION

The present invention relates to the art of electroacoustic transducers and, more specifically, to a digital electroacoustic transducer.

In the art of communication systems, it has become known to convert analog voice signals into pulse code modulated (PCM) signals prior to transmission. The PCM signals are transmitted at a constant rate and each signal represents a certain magnitude and polarity of the analog voice signal at the time in which the analog signal is sampled. Thus, each PCM digital word has a number of magnitude bits and polarity bit. Such digital transmission permits a greater number of voice signals to be transmitted over the same channel because the words may be multiplexed.

At the receiver, the digital word must be converted to an acoustic signal. In one known technique for such conversion, the digital word is first converted back to an analog audio signal. Then, the analog signal controls an electromechanical transducer in a conventional speaker to produce the acoustic wave or signal. However, to the knowledge of the inventor no electroacoustic transducer is known of the type described and claimed herein.

SUMMARY OF THE INVENTION

An object of the present invention is to provide a digital to acoustic converter which does not require a conversion of a digital signal to an analog signal.

It is another object to provide an apparatus which converts a digital signal directly into a displacement of a speaker cone or earphone diaphragm.

According to the present invention, each bit of digital word controls the application of a voltage across a segment of a piezoelectric beam. The beam is fixed at one end and the total deflection at the free end is related to the magnitude of the digital word. The free end of the beam is connected to an acoustic device, such as a speaker cone.

The apparatus according to the invention converts a digital word having a plurality of magnitude bit locations into an acoustic wave or signal. The apparatus includes a device for converting the magnitude bits into a plurality of suitable voltages, a piezoelectric beam having a free and a fixed end, means for applying each voltage across one of a plurality of elements of the beam and an acoustic device connected to the free end of the beam. When the digital word includes a polarity bit location, the converting device generates voltages of a first or second polarity depending on the presence or absence of a polarity bit. The means for applying the voltages across elements of the beam perferably includes a first layer of a grounded conductive material on one surface of the beam and a second layer of a conductive material on the other surface of the beam, the second layer being divided into a plurality of electrically separated segments, each of which is connected to one of the voltage outputs from the converting device.

In a preferred embodiment of the apparatus of the invention, the digital word is in serial form, and the apparatus includes a device, such as a serial to parallel shift register, for converting the device into parallel form. A buffer generates voltages of a first or second polarity depending on the polarity bit.

The method according to the invention converts a digital word into an acoustic wave by the steps of applying voltages, each of which relates to the presence of a bit of the word, across each of a plurality of segments of a piezoelectric beam to deflect the beam in relation to the magnitude of the word and displacing a speaker cone or earphone diaphragm in response to the deflection of the beam.

DESCRIPTION OF THE PREFERRED EMBODIMENTS

Figure 1:
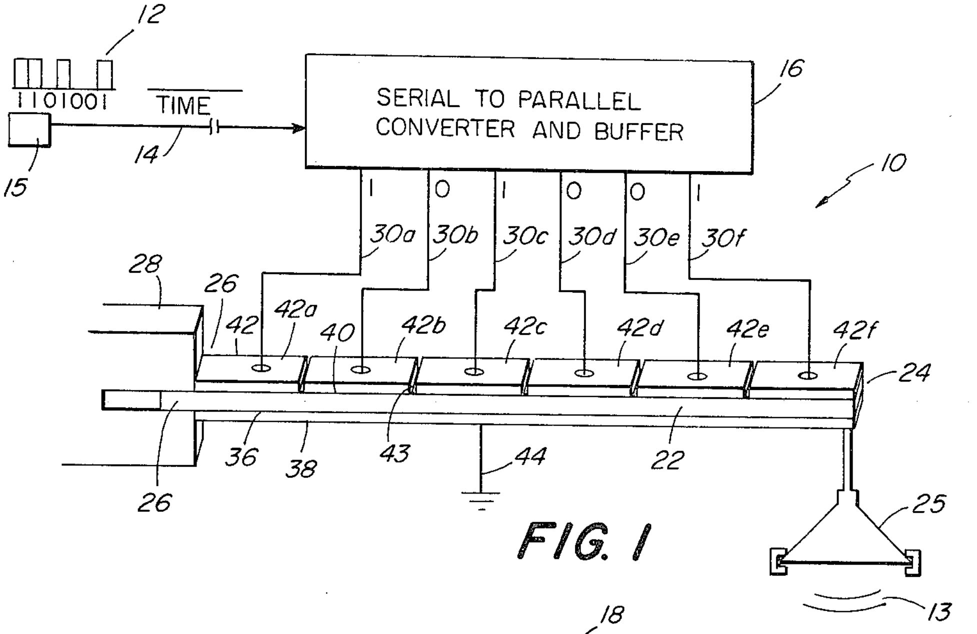
FIG. 1 is a diagram illustrating the principles of the present invention.

In an exemplary embodiment of the present invention, as shown in FIG. 1, there is illustrated an apparatus 10 for converting a digital word having a plurality of magnitude bit locations 12 into an acoustic signal 13. One use for such apparatus resides in telecommunication systems in which analog voice signals are transmitted in a pulse code modulated format. Basically, in such format, the analog voice signal at transmitter 15 is sampled at a constant rate and a digital word is transmitted at each sampling, the digital word representing the polarity and magnitude of the analog voice signal at the sampling time. In one conventional receiver, the digital word is converted back to an analog voice signal which is then applied to a conventional speaker. In the present invention there is no conversion to an analog signal and the digital signal is converted directly into a displacement of a speaker cone. In FIG. 1, the digital word 12 has 7 bits. The first bit on the right is the least significant bit, and the second to the last bit counting from right to left is the most significant bit. The last, or left most, bit represents polarity.

Figure 2:
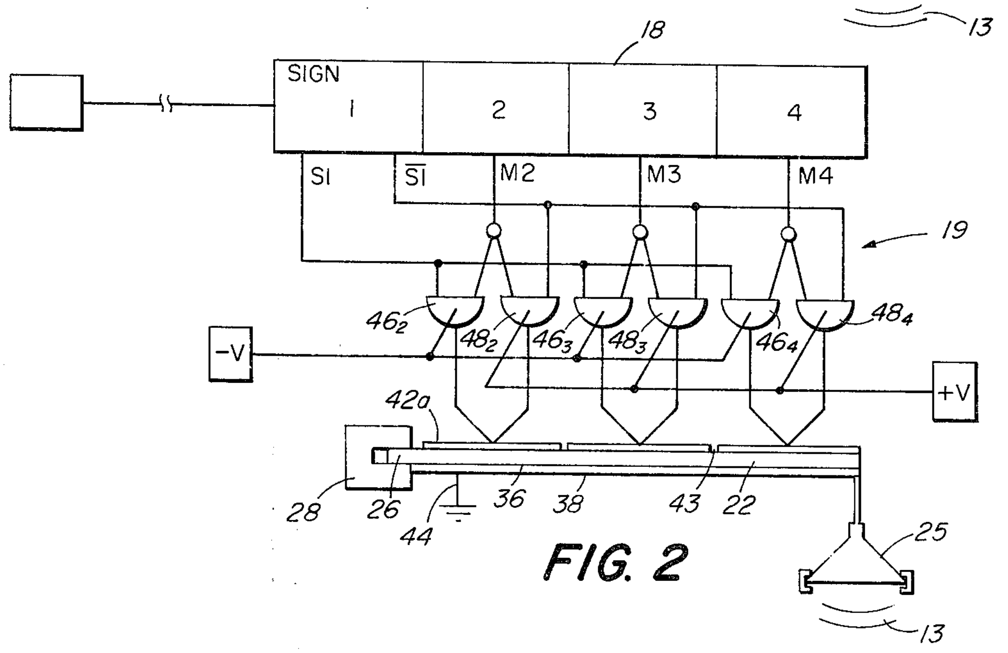
FIG. 2 is a schematic diagram of one embodiment of the present invention.

The digital word is transmitted to the apparatus 10 over a transmission line 14, the word 12 being in serial form. The serial word 12 is directed to a serial to parallel converter and buffer 16. Here, the magnitude bits are converted into parallel form. Preferably, the converter is a serial to parallel shift register 18 as shown in FIG. 2. The buffer portion which preferably comprise a plurality of gates 19 in FIG. 2 converts the magnitude bits into a plurality of voltages suitable for actuating a piezoelectric beam.

A piezoelectric beam 22, which preferably is made of lead zirconate titanate, has a free end 24 and a fixed end 26. The end 26 is held secure by a suitable support member 28. Each of the plurality of voltage on the output wires 30*a* through 30*f* is applied across each of a plurality of elements of the beam 22 to create a deflection of the free end of the beam related to the magnitude of the digital word 12. A suitable acoustic device, such as a speaker cone or earphone diaphragm 25 is connected to the free end 24 and generates an acoustic signal related to the digital word.

The voltage on wire 30*a* which represents the most significant bit is applied across the element of the beam closest to the fixed end, 25 and the voltage on the line 30*f* which represents the least significant bit is connected to the element closest to the fixed end 24. When the MSD is a logic one, the free end deflects a greater amount than the deflection which occurs when the LSD is a logic one.

The beam 22 has a first surface 36 which has located thereon a first layer 38 of a conductive material. A second surface 40 of the beam 22 has located thereon a second layer 42 of a conductive material. The second layer is divided into a plurality of electrically separated segments 42*a* through 42*f*. Preferably, the first layer 38 is grounded as shown at 44. The layers are made of one of the highly conductive metals, such as silver, gold, aluminum etc. and may be deposited on the beam 22 by conventional sputtering and/or photomasking techniques. Particularly, photomasking techniques may be used for the separation 43 between the segments 42*a* to 42*f*. To the knowledge of the inventor, all known piezoelectric materials are nonconductive so that no insulation is required between the layers 38 and 42 and the beam 22. In operation, the voltage across a segment of a beam 22 creates an electrical field within that segment of the piezoelectric material, and in response thereto, the material deflects.

FIG. 2 illustrates in more detail the operation of the serial to parallel converter and the buffer 20 and the manner in which the beam may be made to deflect in one of two directions depending on the polarity of the digital word 12. For simplicity, a four bit digital word is used with one bit being for polarity. It is understood, however, that the invention is applicable to digital words having any number of bits. Thus, FIG. 2 illustrates an electroacoustic transducer for converting a serial digital word of the type having a plurality of bit locations including a polarity bit and a plurality of magnitude bits having at least a most and a least significant bit into an acoustic signal. Acoustic signal refers to the generation of an acoustic wave 13 into the atmosphere. The converter 18 is a four stage serial to parallel shift register; stage 1 retains the polarity bit, and stages 2 through 4 retain the magnitude bits, stage 2 being for the most significant bit. The buffer 19 converts voltage indicating the magnitude bits into a voltage magnitude which is suitable for deflecting the beam. In addition, the buffer 19 controls the polarity of the beam deflecting voltage depending on the state of the polarity bit location.

Referring more specifically to the buffer 19, a voltage from a source (−V) is controlled by a first plurality of gate devices $46_2$ through $46_4$ and a voltage from a source (+V) is controlled by a second plurality of gate devices $48_2$ through $48_4$. Preferably, the gates 46 and 48 are AND gates of the type which provide an output of −V, or +V volts whenever all the outputs to the gate are logic "1"s. One of the inputs to all of the gates 46 is the true state S1 of the sign bit stage of the shift register 18. The inverted state S1 of the sign bit stage is applied to all of the gates 48. Thus, when the sign bit is a "1" only gates 46 may be enabled, and when the sign is a logic "0", only gates 48 may be enabled. The true state M2 through M4 of each magnitude bit stage of the shift register 18 is applied to one of the gates 46 and 48. Thus, for example, if the digital word were 1011, gates $46_3$ and $46_4$ would have outputs of −V volts.

Figure 3:
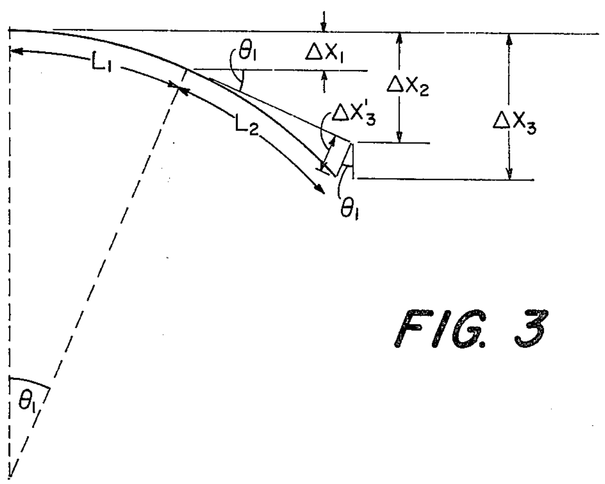
FIG. 3 is a diagram illustrating the operation of the apparatus of the invention.

The theory of the operation of the piezoelectric beam is described below with the aid of FIG. 3. A beam of length L1 + L2 is fixed at the left hand end of the segment L1.

The deflection for the segment L1 of a piezoelectric beam with the left side of L1 being fixed is as follows:

$$\Delta X_1 = \frac{L1\, d\, V}{w\, t}$$

where $\Delta X_1$ = the verticle displacement of the right side of L1

$w$ = width of the beam $t$ = thickness of the beam

V = applied voltage $d$ = strain coefficient ($0.697 \times 10^{-6}$ cm²/volt for PbZT)

The deflection at the end of $L_2$ when $L_2$ is not energized but $L_1$ is energized is as follows:

$$\Delta X_2 = \Delta X_1 + L2 \sin \theta_1$$

For small angles of $\theta_1$ $$\Delta X_2 = \frac{d\, V\, (L1 + 2L2)}{w\, t}$$

The deflection with both L2 and L1 energized is approximated as follows:

$$\Delta X_3 = \Delta X_1 + L2 \sin \theta + \Delta X_3' \cos \theta_1$$

$$\Delta X'_3 = \frac{d\, V\, L2}{w\, t}$$

since $\cos \theta_1 = 1$ for small angles of $\theta_1$ $$\Delta X_3 = \frac{d\, V}{w\, t}(L1 + 3L2)$$

The above are approximations for a two segment beam. The results for a beam having any number of segments may be similarly estimated. While the conversion from a digital word to a beam deflection is not precisely linear, conversion is more than adequate for many applications, such as in telephone systems.

The following are typical values for a 3 bit transducer.

minimum deflection + 25μcm $w$ = 0.3163 cm $t$ = 0.0127 cm $d = 0.697 \times 10^{-6}$ cm²/volt V = 12 volts L = 0.7166 cm For a 3 bit transducer, there would be 3 segments each 0.7166 cm long, giving a total length of 2.15 cm. A deflection would be about 75μcm.

The following are typical values for an 8 bit transducer:

minimum deflection = 25μcm

Total length = 2.4 cm $w$ = 0.3163 cm $t$ = 0.00759 cm

V = 28.7 volts

The embodiments of the present invention are merely exemplary and those skilled in the art will be able to make numerous variations and modifications of them without departing from the spirit of the present invention. All such variations and modifications are intended to be included within the scope of the present invention as defined in the following claims.

I claim:

1. An apparatus for converting a sequence of digital words representative of speech in a time division multiplexed format into an acoustic signal, each word having a plurality of magnitude bit locations comprising:

a. means for converting the magnitude bits into a plurality of voltages, each of which represents the occurrence of a bit in one of the magnitude bit locations, b. a beam made of a piezoelectric material and having a free and fixed end, c. means for applying each of the plurality of voltages across each of a plurality of elements of the beam to create a deflection of the free end of the beam related to the magnitude of the digital word, the deflection being in a direction substantially perpendicular to the length of the beam, and d. means responsive to the deflection of the free end for generating an acoustic signal related to the sequence of digital words.

2. The apparatus according to claim 1, wherein the digital word includes a polarity bit location and the converting means further includes means for converting the magnitude bits into one of a plurality of voltages having a first and a second level in response to the state of the polarity bit location to cause the free end of the beam to deflect in any one of the two directions.

3. The apparatus according to claim 1, wherein the voltage representative of the most significant bit is applied across the element of the beam closest to the fixed end and the voltage representative of the least significant bit is applied across the element of the beam closest to the free end, the beam elements having substantially equal surface areas.

4. The apparatus according to claim 1, wherein the voltages have an absolute magnitude greater than zero volts and wherein the applying means includes a first layer of a grounded conductive material on a first surface of the beam and a second layer of a conductive material on a second surface of the beam, the second layer being divided into a plurality of electrically separated segments, each of which is connected to one of the voltage outputs of the converting means.

5. The apparatus according to claim 4, wherein the beam is made of lead zirconate titanate.

6. An electroacoustic transducer for converting a serial digital word, of the type having a plurality of bit locations including locations for a polarity bit and a plurality of magnitude bits having at least a most and a least significant bit, into an acoustic signal, the transducer being adapted to convert digitized audio in a time division multiplexed format into an audio acoustic signal comprising:

a. means for converting the serial digital word into parallel form, b. buffer means for converting each magnitude bit into an output voltage of a first polarity when a bit is present in the polarity bit location and for converting each magnitude bit into an output voltage of a second polarity when a bit is absent from the polarity bit location, c. a piezoelectric structure including a beam made of a piezoelectric, non-conductive material and having fixed and free ends and first and second side surfaces, a first layer of a grounded conductive material on the first surface of the beam and a second layer of conductive material on the second surface of the beam, the second layer being divided into a plurality of electrically separated segments having substantially equal surface areas, each segment being connected to an output of the buffer means with the segment closest to the fixed end being connected to the output corresponding to the most significant bit and the segment closest to the free end being connected to the output corresponding to the least significant bit, the beam being adapted to have its free end deflected in a direction corresponding to the polarity of the word and at a magnitude corresponding to the magnitude of the word and, d. acoustic means connected to the free end for creating an acoustic signal in response to the deflection of the free end of the piezoelectric beam.

7. The transducer according to claim 6, wherein the buffer means includes a first and second plurality of gating means for controlling the application of the voltages of the first and second polarities, respectively, to the segments of the beam, each of the first gating means being enabled by the presence of a polarity bit and by the presence of a respective magnitude bit, each of the second gate means being enabled by the absence of a polarity bit and by the presence of a respective magnitude bit.

8. The transducer according to claim 6, wherein the piezoelectric material is lead zirconate titanate.

9. The transducer according to claim 7, wherein the gating means include AND logic gates.

10. The transducer according to claim 6, wherein the acoustic means includes a speaker cone connected to the free end of the beam so that the speaker cone generates acoustic signals in response to the sequence of deflections of the free end of the beam.

11. The transducer according to claim 6, wherein the converting means includes a serial to parallel shift register.

12. A method of converting a sequence of digital words into an acoustic signal including the steps of:

applying each of a plurality of a voltages representative of each magnitude bit of the digital word across a plurality of segments of a beam made of a piezoelectric material, the beam being fixed at one end and free at another end so that the free end deflects in relation to the magnitude of each digital word, the deflection being in a direction substantially perpendicular to the length of the beam, and displacing a speaker cone in response to the deflection of the beam to create an acoustic signal related to the magnitude of each digital word.

13. The method according to claim 12, further including the step of applying the voltage representative of the most significant bit across the segment closest to the fixed end, and applying the voltage representation of the least significant bit across the segment closest to the free end of the beam, the segments having substantially equal surface areas.

14. The method according to claim 12, wherein the digital word includes a polarity bit and wherein the step of applying the voltages includes the steps of forming a first and second plurality of voltages of different levels in response to the state of the polarity bit to cause the beam to deflect in one of two directions depending on the polarity of the digital word.

* * * * *

PO-1050
(5/69)

UNITED STATES PATENT OFFICE
CERTIFICATE OF CORRECTION

Patent No. 3,947,708 Dated March 30, 1976

Inventor(s) J. Fulenwider

It is certified that error appears in the above-identified patent and that said Letters Patent are hereby corrected as shown below:

Column 4, line 9, delete "verticle" and insert --vertical--;

Signed and Sealed this

*fifteenth* Day of *June 1976*

[SEAL]

*Attest:*

RUTH C. MASON
*Attesting Officer*

C. MARSHALL DANN
*Commissioner of Patents and Trademarks*